United States Patent
Morita (10) Patent No.: US 9,155,196 B2
(45) Date of Patent: Oct. 6, 2015

(54) WIRING BOARD

(71) Applicant: IBIDEN CO., LTD., Ogaki-shi (JP)

(72) Inventor: Haruhiko Morita, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/290,193

(22) Filed: May 29, 2014

(65) Prior Publication Data

US 2014/0353022 A1     Dec. 4, 2014

(30) Foreign Application Priority Data

May 30, 2013    (JP) .................................. 2013-113867

(51) Int. Cl.
*H05K 1/16* (2006.01)
*H05K 1/02* (2006.01)
*H05K 1/03* (2006.01)
*H05K 1/11* (2006.01)
*H05K 3/24* (2006.01)
*H05K 3/46* (2006.01)

(52) U.S. Cl.
CPC .............. *H05K 1/165* (2013.01); *H05K 1/0225* (2013.01); *H05K 1/0366* (2013.01); *H05K 1/116* (2013.01); *H05K 3/244* (2013.01); *H05K 3/4602* (2013.01); *H05K 2201/0191* (2013.01); *H05K 2201/0293* (2013.01); *H05K 2201/0347* (2013.01); *H05K 2201/0723* (2013.01); *H05K 2201/0792* (2013.01); *H05K 2201/096* (2013.01); *H05K 2201/09136* (2013.01); *H05K 2201/09263* (2013.01); *H05K 2201/09454* (2013.01); *H05K 2201/09527* (2013.01); *H05K 2201/09672* (2013.01); *H05K 2201/09836* (2013.01)

(58) Field of Classification Search
CPC ................ H05K 1/165; H05K 1/0237–1/0253
See application file for complete search history.

(56) References Cited

FOREIGN PATENT DOCUMENTS

JP     2009-016504     1/2009

*Primary Examiner* — Jeremy C Norris
(74) *Attorney, Agent, or Firm* — Oblon, McClelland, Maier & Neustadt, L.L.P.

(57) ABSTRACT

A wiring board includes a substrate having a laminated-inductor forming portion and including multiple first insulation layers and a second insulation layer formed on a first side of the first insulation layers such that the first insulation layers have the laminated-inductor forming portion, and a planar conductor formed on the second insulation layer of the substrate and formed to shield electromagnetic force generated from the laminated-inductor forming portion of the substrate. The laminated-inductor forming portion of the substrate has multiple inductor patterns formed on the first insulation layers and multiple via conductors connecting the inductor patterns through the first insulation layers, and the inductor patterns include an uppermost inductor pattern formed between the second insulation layer and the first insulation layers such that the uppermost inductor pattern has a distance of 100 μm or more from the planar conductor.

20 Claims, 11 Drawing Sheets

WIRING BOARD

CROSS-REFERENCE TO RELATED APPLICATIONS

The present application is based upon and claims the benefit of priority to Japanese Patent Application No. 2013-113867, filed May 30, 2013, the entire contents of which are incorporated herein by reference.

BACKGROUND OF THE INVENTION

1. Field of the Invention

The present invention relates to a wiring board.

2. Description of Background Art

JP2009-16504A describes forming a laminated inductor in a wiring board by electrically connecting conductive patterns formed in different layers. The entire contents of this publication are incorporated herein by reference.

SUMMARY OF THE INVENTION

According to one aspect of the present invention, a wiring board includes a substrate having a laminated-inductor forming portion and including multiple first insulation layers and a second insulation layer formed on a first side of the first insulation layers such that the first insulation layers have the laminated-inductor forming portion, and a planar conductor formed on the second insulation layer of the substrate and formed to shield electromagnetic force generated from the laminated-inductor forming portion of the substrate. The laminated-inductor forming portion of the substrate has multiple inductor patterns formed on the first insulation layers and multiple via conductors connecting the inductor patterns through the first insulation layers, and the inductor patterns include an uppermost inductor pattern formed between the second insulation layer and the first insulation layers such that the uppermost inductor pattern has a distance of 100 μm or more from the planar conductor.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

In the drawings, arrows (Z1, Z2) each indicate a lamination direction of a wiring board (or a thickness direction of the wiring board) corresponding to a direction along a normal line to main surfaces (upper and lower surfaces) of the wiring board. On the other hand, arrows (X1, X2) and (Y1, Y2) each indicate a direction perpendicular to the lamination direction (or a direction parallel to the surface of each layer of the substrate). The main surfaces of the wiring board are on the X-Y plane, and a side surface of the wiring board is on the X-Z plane or Y-Z plane.

In the following embodiments, a conductive layer is structured to have one or multiple conductive patterns. A conductive layer may include a conductive pattern that forms a conductive circuit, such as wiring (including ground), a pad, a land or the like. Alternatively, a conductive layer may be a planar conductive pattern that does not form a conductive circuit.

Of the conductors formed in openings, the conductor formed in a via hole is a via conductor, the conductor formed in a through hole is a through-hole conductor, and the conductor filled in an opening is a filled via.

A land is a conductor formed on a hole (via hole, through hole or the like) or on its periphery. At least part of the land is formed to be contiguous to the conductor in the hole (via conductor, through-hole conductor or the like).

Being stacked indicates a via conductor is formed on the land of another via conductor positioned in its lower layer. Namely, if the bottom surface of an upper-layer via conductor is not off the land of a lower-layer via conductor, the upper-layer via conductor is stacked on the lower-layer via conductor.

As the resin material for interlayer material (insulation layer), resin film for interlayer insulation layers (brand name: ABF-45SH, made by Ajinomoto), for example, is used.

Figure 1:
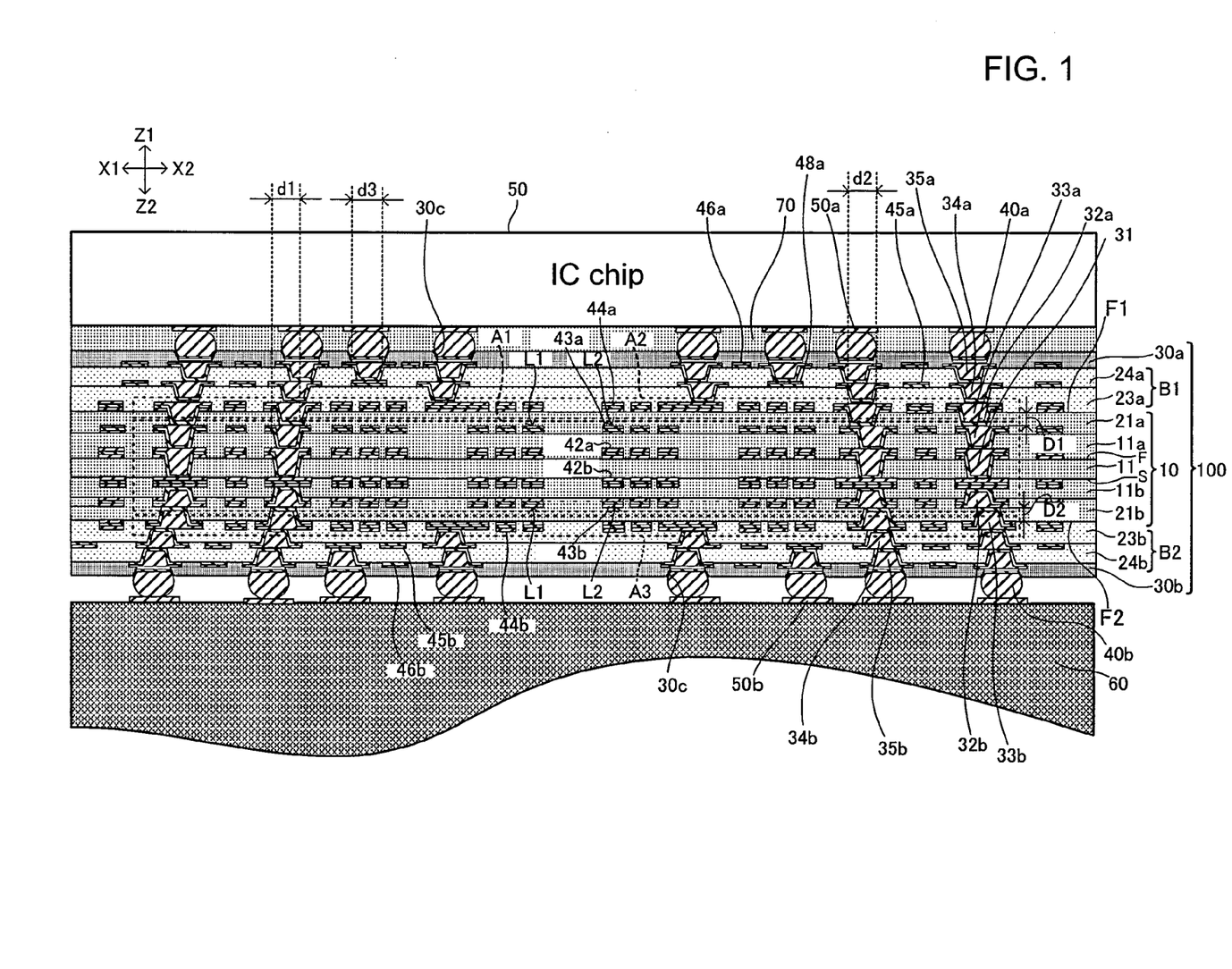
FIG. 1 is a cross-sectional view of a wiring board according to an embodiment of the present invention.

Wiring board 100 according to the present embodiment is a multilayer printed wiring board shown in FIG. 1, for example. More specifically, it is a buildup multilayer wiring board having core substrate 10.

As shown in FIG. 1, IC chip 50 as a first semiconductor element is mounted on wiring board 100. Wiring board 100 is mounted on motherboard 60 as shown in FIG. 1. The space between wiring board 100 and IC chip 50 is encapsulated with underfill resin 70.

Wiring board 100 has core substrate 10 in the approximate center of a thickness direction (Z1-Z2 direction). Core substrate 10 has first main surface (F1) (on the (Z1) side) and second main surface (F2) (on the (Z2) side) opposite the first main surface.

Core substrate 10 has laminated-inductor forming section (A1) which is structured as follows: first insulation layer (middle first insulation layer) 11 having upper surface (F) and lower surface (S) opposite upper surface (F); an upper first conductive layer which includes upper inductor pattern (42a) and is formed on upper surface (F) of first insulation layer 11; a lower first conductive layer which includes lower inductor pattern (42b) and is formed on lower surface (S) of first insulation layer 11; uppermost first insulation layer (11a) formed on upper surface (F) of first insulation layer 11 and on the upper first conductive layer; lowermost first insulation layer (11b) formed under lower surface (S) of first insulation layer 11 and under the lower first conductive layer; an uppermost first conductive layer which includes uppermost inductor pattern (43a) formed on uppermost first insulation layer (11a); a lowermost first conductive layer which includes lowermost inductor pattern (43b) formed under lowermost first insulation layer (11b); first via conductor (middle first via conductor) 31 which is formed in first insulation layer 11 and connects the upper first conductive layer (upper inductor pattern 42a) and the lower first conductive layer (lower inductor pattern 42b); uppermost first via conductor (32a) which is formed in uppermost first insulation layer (11a) and connects the uppermost first conductive layer (uppermost inductor pattern 43a) and the upper first conductive layer; and lowermost first via conductor (32b) which is formed in lowermost first insulation layer (11b) and connects the lowermost first conductive layer (lowermost inductor pattern 43b) and the lower first conductive layer.

Figure 3:
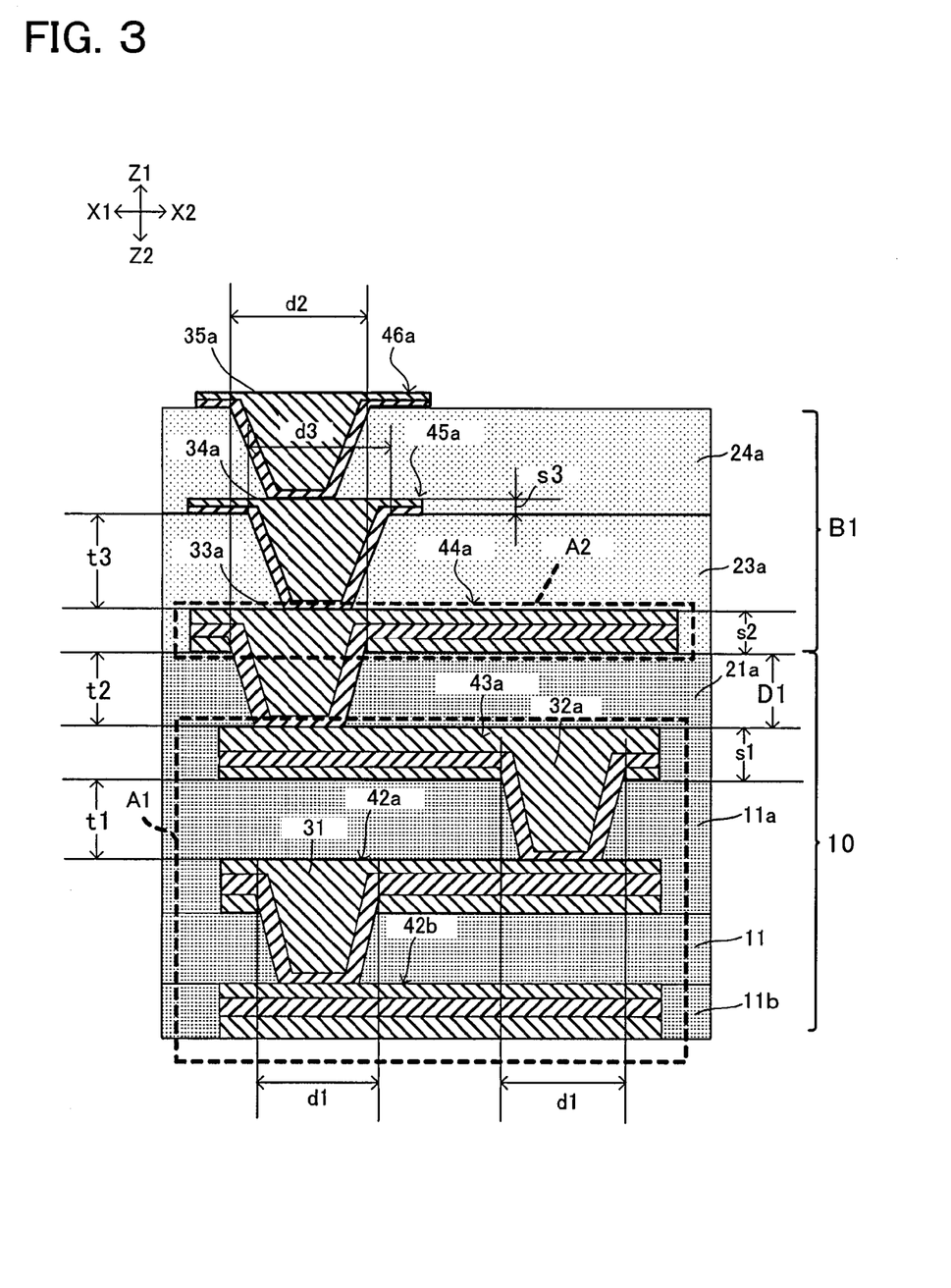
FIG. 3 is a cross-sectional view showing part of the wiring board according to the embodiment.

Core substrate 10 further includes upper second insulation layer (21a) formed on uppermost first insulation layer (11a) and on the uppermost first conductive layer, and upper second conductive layer (44a) formed on upper second insulation layer (21a). Upper second conductive layer (44a) includes upper planar conductor (A2). Upper planar conductor (A2) is formed above uppermost inductor pattern (43a) with upper second insulation layer (21a) disposed in between. As shown in FIG. 3, upper planar conductor (A2) is formed directly above uppermost inductor pattern (43a). Here, distance (D1) is 100 μm or greater between uppermost inductor pattern (43a) and upper planar conductor (A2).

Upper second conductive layer (44a) and the uppermost first conductive layer (uppermost inductor pattern 43a) are connected by upper second via conductor (33a) formed in upper second insulation layer (21a). Upper planar conductor (A2) is a power-source layer. Upper planar conductor (A2) and uppermost inductor pattern (43a) are connected by upper second via conductor (33a) (see FIG. 3).

First main surface (F1) corresponds to the upper surface of upper second insulation layer (21a), and upper planar conductor (A2) is formed on the upper surface of upper second insulation layer (21a).

Core substrate 10 further includes lower second insulation layer (21b) formed under lowermost first insulation layer (11b) and under the lowermost first conductive layer (lowermost inductor pattern 43b), and lower second conductive layer (44b) formed under lower second insulation layer (21b). Lower second conductive layer (44b) has lower planar conductor (A3). Distance (D2) is 100 μm or greater between lowermost inductor pattern (43b) and lower planar conductor (A3). Lower planar conductor (A3) is formed below lowermost inductor pattern (43b) with lower second insulation layer (21b) in between. Lower planar conductor (A3) is formed directly below lowermost inductor pattern (43b).

Lower second conductive layer (44b) and the lowermost first conductive layer (lowermost inductor pattern 43b) are connected by lower second via conductor (33b) formed in lower second insulation layer (21b). Lower planar conductor (A3) is a power-source layer, and lower planar conductor (A3) and lowermost inductor pattern (43b) are connected by lower second via conductor (33b).

Second main surface (F2) corresponds to the lower surface of lower second insulation layer (21b), and lower planar conductor (A3) is formed below the lower surface of lower second insulation layer (21b).

Laminated inductor (L1) is formed with uppermost inductor pattern (43a), uppermost first via conductor (32a), upper inductor pattern (42a), middle first via conductor 31, lower inductor pattern (42b), lowermost first via conductor (32b) and lowermost inductor pattern (43b). Laminated inductor (L1) is formed between upper and lower planar conductors (A2, A3).

Figure 2:
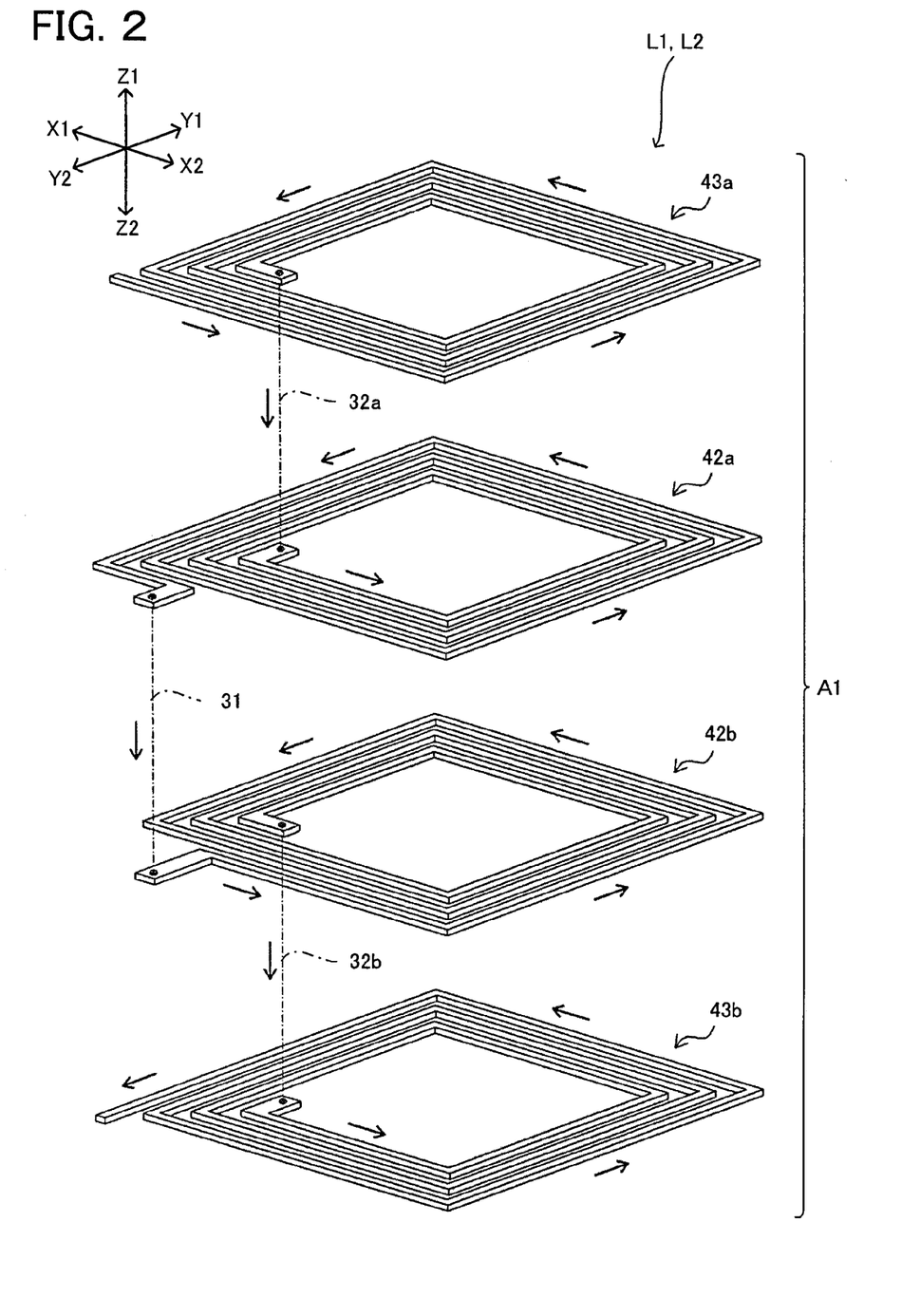
FIG. 2 is a view showing a pattern of a laminated inductor according to the embodiment.

FIG. 2 schematically shows laminated inductor (L1). Uppermost inductor pattern (43a), upper inductor pattern (42a), lower inductor pattern (42b) and lowermost inductor pattern (43b) are shown in that order from the top of FIG. 2. In FIG. 2, via conductors are indicated schematically by a dotted line. As shown in FIG. 2, each inductor pattern is structured as a helical conductive pattern. Insulation layers between inductor patterns are omitted from FIG. 2.

When uppermost inductor pattern (43a), lower inductor pattern (42b) and lowermost inductor pattern (43b) are projected in a direction perpendicular to a surface of first insulation layer (11a), the projected images of inductor patterns (43a, 42b, 43b) are preferred to substantially overlap upper inductor pattern (42a).

Laminated-inductor forming section (A1) further includes laminated inductor (L2) structured the same as laminated inductor (L1) as shown in FIG. 1. As illustrated, multiple laminated inductors are formed in laminated-inductor forming section (A1).

Electrical connection of different laminated inductors (L1, L2) may be made in series or in parallel. To connect different laminated inductors (L1, L2) at lower resistance, parallel connection is a preferred connection method.

Laminated-inductor forming section (A1) may have another inductor pattern and another insulation layer between uppermost first insulation layer (11a) and middle first insulation layer 11. Laminated-inductor forming section (A1) may have another inductor pattern and another insulation layer between lowermost first insulation layer (11b) and middle first insulation layer 11. Including another inductor pattern and another insulation layer, inductor patterns and insulation layers are laminated alternately, and two inductor patterns formed in different layers are connected by a via conductor that penetrates through the insulation layer disposed between the two inductor patterns.

In FIGS. 1 and 2, the number of layers of inductor patterns in laminated inductors (L1, L2) is four. However, as long as desired inductance is achieved, the number of layers is not limited specifically in laminated inductors (L1, L2).

Insulation layers of core substrate 10 are each preferred to contain reinforcing material. More specifically, middle first insulation layer 11, uppermost first insulation layer (11a), upper second insulation layer (21a), lowermost first insulation layer (11b), and lower second insulation layer (21b) contain reinforcing material. Examples of reinforcing material are glass cloth, nonwoven glass fabric, aramid cloth, nonwoven aramid fabric and the like.

Among middle first insulation layer 11, uppermost first insulation layer (11a), upper second insulation layer (21a), lowermost first insulation layer (11b) and lower second insulation layer (21b) that form core substrate 10, middle first insulation layer 11 is formed in the center of a thickness direction in FIG. 1.

Upper buildup layer (B1) is formed on first main surface (F1) of core substrate 10, and lower buildup layer (B2) is formed under second main surface (F2).

Upper buildup layer (B1) includes upper third insulation layer (23a), upper third conductive layer (45a) formed on upper third insulation layer (23a), uppermost third insulation layer (24a) formed on upper third insulation layer (23a) and upper third conductive layer (45a), uppermost third conductive layer (46a) formed on uppermost third insulation layer (24a), upper third via conductor (34a) which penetrates through upper third insulation layer (23a) and connects upper third conductive layer (45a) and upper second conductive layer (44a), and uppermost third via conductor (35a) which penetrates through uppermost third insulation layer (24a) and connects uppermost third conductive layer (46a) and upper third conductive layer (45a).

Lower buildup layer (B2) includes lower third insulation layer (23b), lower third conductive layer (45b) formed under lower third insulation layer (23b), lowermost third insulation layer (24b) formed under lower third insulation layer (23b) and lower third conductive layer (45b), lowermost third conductive layer (46b) formed under lowermost third insulation layer (24b), lower third via conductor (34b) which penetrates through lower third insulation layer (23b) and connects lower third conductive layer (45b) and lower second conductive layer (44b), and lowermost third via conductor (35b) which penetrates through lowermost third insulation layer (24b) and connects lowermost third conductive layer (46b) and lower third conductive layer (45b).

Upper and lower third insulation layers (23a, 24a, 23b, 24b) included in upper and lower buildup layers (B1, B2) do not contain reinforcing material, and are formed with insulative resin film such as interlayer insulation film (brand name: ABF-45SH, made by Ajinomoto), for example. Third insulation layers (23a, 24a, 23b, 24b) contain inorganic particles.

Upper solder-resist layer (30a) having opening (30c) is formed on upper buildup layer (B1). In opening (30c), solder bump (40a) is provided to connect wiring board 100 and IC chip 50 through electrode (50a). Lower solder-resist layer (30b) having opening (30c) is formed under lower buildup layer (B2). In opening (30c), solder bump (40b) is provided to connect wiring board 100 and motherboard 60 through electrode (50b).

The voltage of power supplied to IC chip 50 is made smooth by laminated inductors (L1, L2) and a capacitor (not shown).

As shown in FIG. 1, upper planar conductor (A2) is formed on first main surface (F1) of core substrate 10, and lower planar conductor (A3) is formed on second main surface (F2). Laminated inductors (L1, L2) are formed between upper and lower planar conductors (A2, A3). A pair of upper and lower planar conductors (A2, A3) sandwiching laminated inductors (L1, L2) work as electromagnetic shielding. Accordingly, electromagnetic fields ranging from laminated inductors (L1, L2) to buildup layers (B1, B2) are less likely to be formed.

Upper and lower planar conductors (A2, A3) are connected to power source or ground and work as a power-source or a ground planar conductor. Upper planar conductor (A2) is preferred to be a power-source layer. When power is supplied from lower buildup layer (B2) to IC chip 50 through laminated inductors (L1, L2) and upper planar conductor (A2), power is supplied from motherboard 60 to IC chip 50 through short wiring. In such a case, upper and lower planar conductors (A2, A3) are each preferred to be a power-source layer. On the other hand, when power is supplied to IC chip 50 from upper buildup layer (B1) through laminated inductors (L1, L2) and upper planar conductor (A2), upper planar conductor (A2) is preferred to be a power-source layer and lower planar conductor (A3) is preferred to be a ground layer. In such a case, a stable supply of power is provided to the IC chip since laminated inductors (L1, L2) are sandwiched by a power-source layer and a ground layer.

In the present embodiment, upper second insulation layer (21a) is formed between uppermost inductor pattern (43a) and upper planar conductor (A2), and lower second insulation layer (21b) is formed between lowermost inductor pattern (43b) and lower planar conductor (A3), as shown in FIG. 1.

As shown in FIGS. 1 and 3, distance (D1) between upper planar conductor (A2) and uppermost inductor pattern (43a) is 100 μm or greater. Also, distance (D2) between lower planar conductor (A3) and lowermost inductor pattern (43b) is 100 μm or greater. Here, distances (D1, D2) each indicate the distance between conductors sandwiching an insulation layer.

Distance (D1) is shown in FIG. 3. When distances (D1, D2) are each set at 100 μM or greater, the distance between uppermost inductor pattern (43a) and upper planar conductor (A2) and the distance between lowermost inductor pattern (43b) and lowermost planar conductor (A3) are increased in a thickness direction of wiring board 100 (Z1-Z2 direction). Accordingly, magnetic flux (lines of magnetic force) generated in laminated inductor (L1) is less likely to be inhibited by upper and lower planar conductors (A2, A3). As a result, the impact of eddy current which occurs in upper and lower planar conductors (A2, A3) is reduced. Therefore, laminated inductors (L1, L2) exhibit desired inductor characteristics (inductance, Q factor).

It is an option for laminated inductor (L1) to be connected to upper planar conductor (A2) through upper second via conductor (33a). By so setting, upper planar conductor (A2) and uppermost inductor pattern (43a) are connected by upper second via conductor (33a). In such a case, upper planar conductor (A2) is preferred to be a conductive layer (power-source layer) to supply power. Then, when laminated inductor (L1) is electrically connected to IC chip 50 through upper buildup layer (B1), power is supplied to IC chip 50 from upper planar conductor (A2) through laminated inductor (L1). Laminated inductors (L1, L2) are directly below IC chip 50, and are formed in the central region of core substrate 10. Accordingly, a stable supply of power is provided to IC chip 50. Since the volumes of conductors in laminated inductors (L1, L2) are small, laminated inductors (L1, L2) are preferred to be formed in the central region of core substrate 10.

Alternatively, laminated inductor (L1) may be connected to lower planar conductor (A3) through lower second via conductor (33b). By so setting, lower planar conductor (A3) and lowermost inductor pattern (43b) are connected by lower second via conductor (33b). In such a case, lower planar conductor (A3) is preferred to be a conductive layer (power-source layer) to supply power.

Laminated inductor (L1) is connected to upper and lower planar conductors (A2, A3) through upper and lower second via conductors (33a, 33b). Accordingly, external power is supplied to IC chip 50 through motherboard 60, lower buildup layer (B2), laminated inductor (L1) and upper buildup layer (B1).

Distances (D1, D2) are each preferred to be 120 µm or greater, and more preferably 130 µm or greater. By so setting, magnetic flux (lines of magnetic force) generated in laminated inductors (L1, L2) is even more certain not to be inhibited. As a result, desired inductor characteristics (inductance, Q factor) are achieved in laminated inductors (L1, L2).

In addition, thickness (t2) of upper and lower second insulation layers (21a, 21b) is greater than thickness (t1) in each of first insulation layers (11, 11a, 11b). Thickness (t1) of first insulation layers (11, 11a, 11b) and thickness (t2) of second insulation layers (21a, 21b) are substantially equal to the distance of adjacent conductive layers as shown in FIG. 3. By such a structure as well, magnetic flux (lines of magnetic force) generated in laminated inductors (L1, L2) is not inhibited, and desired inductor characteristics (inductance, Q factor) are easier to achieve in laminated inductors (L1, L2).

Figure 4A:
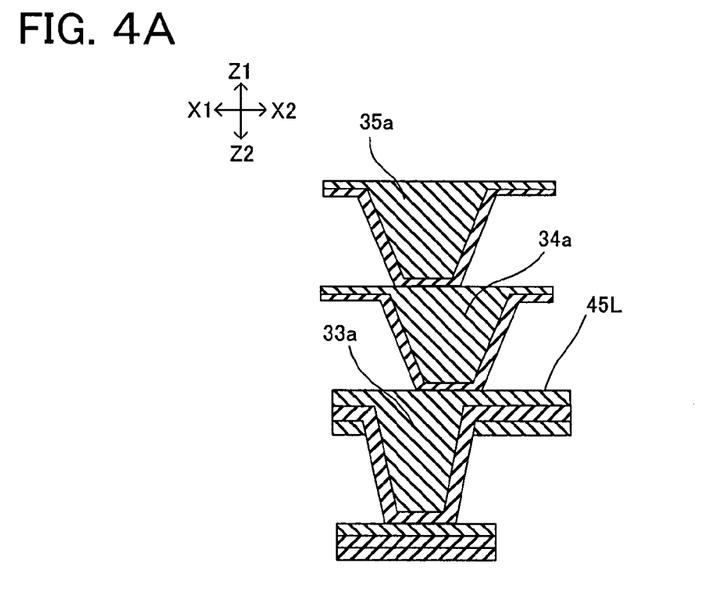
FIG. 4A is a view showing an example of via conductors in the embodiment which are laminated along a straight line.
Figure 4B:
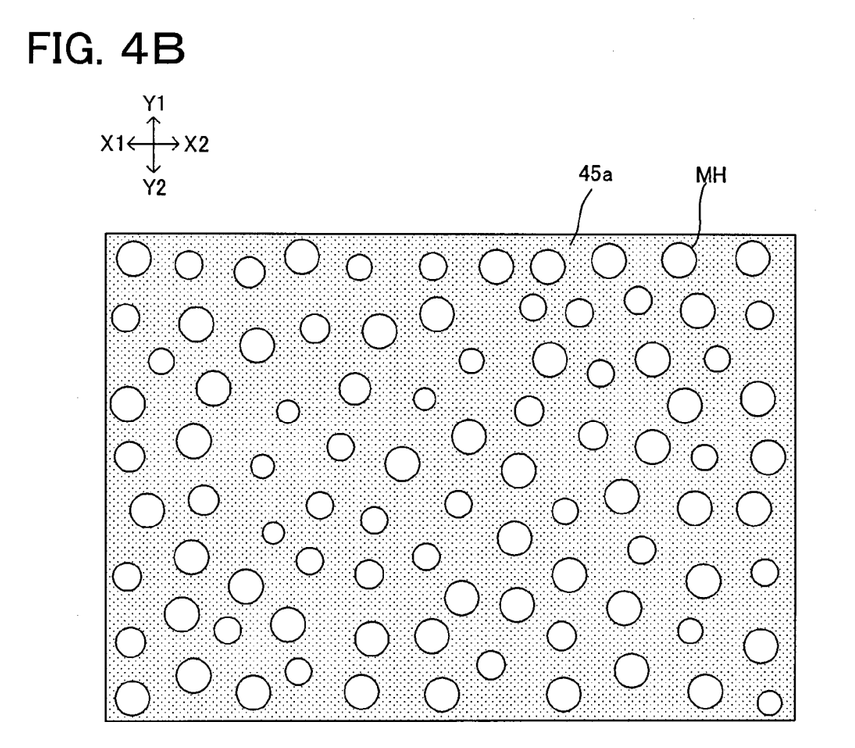
FIG. 4B is a plan view showing an example of the planar conductor according to the embodiment.

FIG. 4B shows an example of upper and lower planar conductors (A2, A3). As shown in FIG. 4B, upper and lower planar conductors (A2, A3) may have mesh holes (MH). By so setting, escaping portions for magnetic flux generated in laminated inductors (L1, L2) are ensured in planar conductors (A2, A3), and desired inductor characteristics (inductance, Q factor) are easier to achieve in laminated inductors (L1, L2).

Figure 6A:
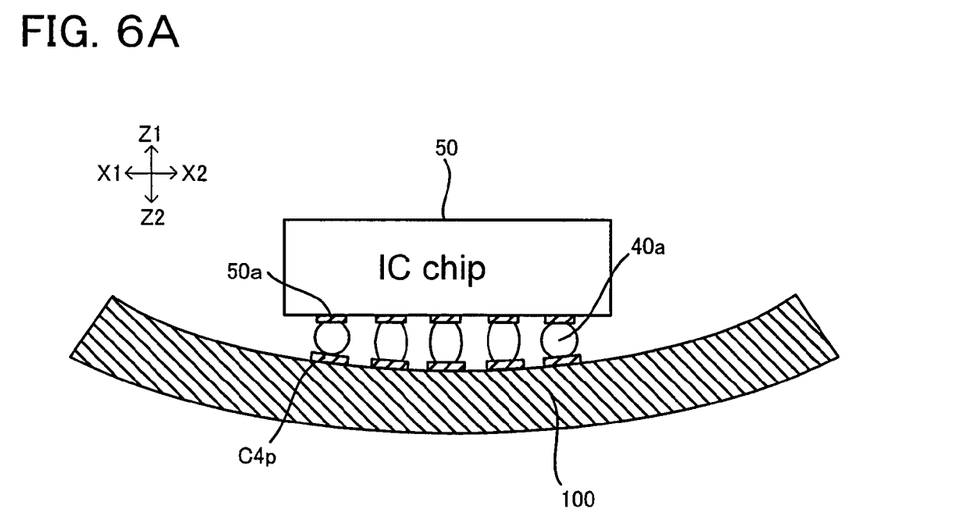
FIG. 6A is a cross-sectional view showing a state in which an IC chip is mounted on a wiring board warped in a concave shape.
Figure 6B:
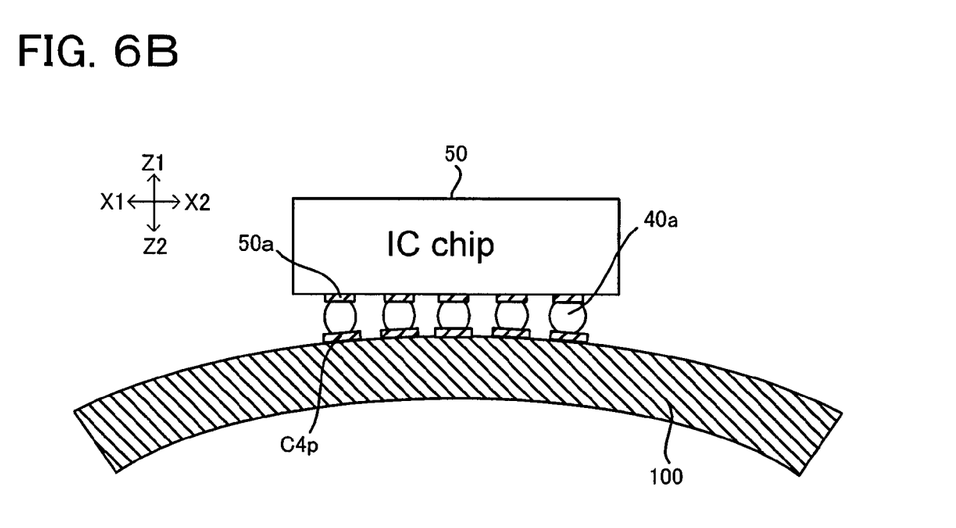
FIG. 6B is a cross-sectional view showing a state in which an IC chip is mounted on a wiring board warped in a convex shape.
Figure 7:
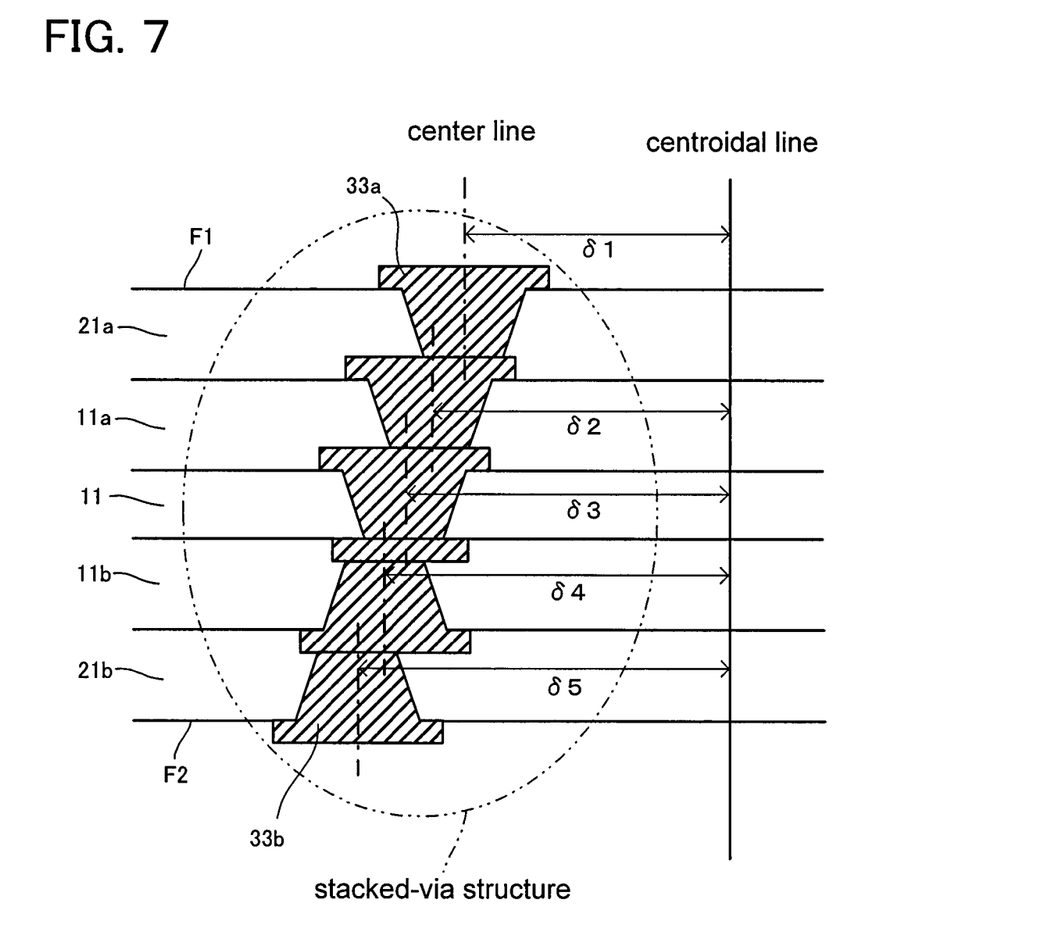
FIG. 7 is a view showing a stacked-via structure in detail.

As shown in FIG. 1, uppermost first via conductor (32a), first via conductor 31 and lower first via conductor (32b), which are formed on the outer side of laminated inductors (L1, L2), may be laminated in a substantially straight line in a thickness direction of core substrate 10. A stacked-via structure is formed by uppermost first via conductor (32a), middle first via conductor 31 and lower first via conductor (32b). Such a stacked-via structure is preferred to be formed in the peripheral region of the wiring board, and to incline toward the periphery of wiring board 100. By so setting, the degree of warping in wiring board 100 decreases. In FIG. 1, a stacked-via structure inclines from first main surface (F1) of core substrate 10 toward second main surface (F2). Such a stacked-via structure is shown in FIG. 7. The straight line passing through the gravity center of a main surface of wiring board 100 and perpendicular to the main surface is a centroidal line. The straight line passing through the center of a via conductor and perpendicular to the main surface is a center line. As shown in FIG. 7, distances (δ1)~(δ5) between the center line and the centroidal line become longer from first main surface (F1) toward second main surface (F2). To reduce the degree of warping in wiring board 100 caused by the difference between the thermal expansion coefficient of wiring board 100 and the thermal expansion coefficient of IC chip 50, the stacked-via structure is preferred to incline in the direction of the periphery of wiring board 100 from first main surface (F1) toward second main surface (F2). From the viewpoint of connection reliability, the warping of wiring board 100 is preferred to be in a concave shape. FIGS. 6A and 6B respectively show a state in which IC chip 50 is mounted on a wiring board 100 warped in a concave shape (FIG. 6A) and on a wiring board 100 warped in a convex shape (FIG. 6B). The connected portion in the periphery of IC chip 50 (solder bump 40a) receives greater stress than the connected portion in the center. In FIG. 6A, the distance between IC chip 50 and wiring board 100 is shorter on the periphery. Thus, the connected area is greater between a connection member such as solder bump (40a) and electrode (50a) of IC chip 50 or a connection member such as solder bump (40a) and C4 pad (C4p) of wiring board 100. By contrast, in FIG. 6B, the distance between IC chip 50 and wiring board 100 is longer on the periphery of IC chip 50. Thus, the connected area is smaller between a connection member such as solder bump (40a) and electrode (50a) of IC chip 50 or a connection member such as solder bump (40a) and C4 pad (C4p) of wiring board 100. When wiring board 100 is warped in a concave shape as shown in FIG. 6A, since second main surface (F2) of core substrate 10 (see FIG. 5K) is elongated, the inclination direction of a stacked-via structure and the elongation direction are the same, thereby enhancing the reliability of the stacked-via structure. Also, since the stacked-via structure inclines outward from first main surface (F1) toward second main surface (F2), wiring board 100 tends to warp in a concave shape.

In the present embodiment, "being laminated in a straight line" means that at least part of upper and lower via conductors adjacent in a thickness direction overlap in a planar view. According to such a structure, if a stacked-via structure is used for power source, the power-source line is shortened. Thus, the loss of voltage supplied to IC chip 50 (see FIG. 1) is minimized.

When ground layers and signal lines formed on the upper- and lower-surface sides of core substrate 10 are connected by a stacked-via structure, they are connected by a minimum distance. Moreover, when core substrate 10 has a stacked-via structure, the rigidity of core substrate 10 is enhanced, and the degree of warping is reduced in wiring board 100.

In FIG. 1, multiple stacked-via structures are formed surrounding laminated inductors (L1, L2). The distance between adjacent stacked-via structures is 150~350 µm. Stacked-via structures work as electromagnetic shielding.

In the present embodiment, laminated inductors (L1, L2) are formed directly below the region where IC chip 50 is mounted (the region where solder bumps (40a) are formed). Accordingly, a stable supply of power is provided to IC chip 50.

In the present embodiment, reinforcing material is contained in each of insulation layers (11, 11a, 11b, 21a, 21b) of core substrate 10. Thus, the rigidity of core substrate 10 is enhanced by such reinforcing material, and thermal contraction of the insulation layers is suppressed. As a result, warping caused by heat is suppressed from occurring in wiring board 100.

In the present embodiment, inductor patterns are formed to be vertically symmetrical with first insulation layer 11 set as the center of symmetry. In such a case, first insulation layer 11 is center first insulation layer 11. If inductor patterns are formed only on the upper surface of center first insulation layer 11, conductor volumes significantly differ in the upper and lower portions of wiring board 100 with first insulation layer 11 set as the center. Accordingly, when heat is generated, the amounts of thermal contraction are different in the upper and lower portions of wiring board 100, and wiring board 100 tends to warp. By contrast, since inductor patterns are formed vertically symmetrical with first insulation layer 11 set as the center of symmetry in wiring board 100 of the present embodiment, the difference in conductor volumes is small in the upper and lower portions of wiring board 100 with center first insulation layer 11 set as a base. As a result, warping caused by heat is suppressed from occurring in wiring board 100.

In the present embodiment, first main surface (F1) and second main surface (F2) of core substrate 10 are electrically connected by each via conductor formed in each insulation layer of core substrate 10. Thus, the depth of an opening per via conductor is smaller than the depth of a penetrating hole that penetrates through all the insulation layers of core substrate 10. Accordingly, since the diameter of each via-conductor opening is smaller, it is easier to fill each opening with plating. As a result, voids are less likely to occur in via conductors in laminated inductors (L1, L2), and reliability is thereby enhanced in each via conductor. Moreover, electrical connectability is improved between upper and lower surfaces of core substrate 10. As described, characteristics of laminated inductors (L1, L2) (especially, the Q factor) are enhanced by suppressing voids from occurring in laminated inductors (L1, L2).

In the present embodiment, diameter (d1) (μm) of uppermost first via conductor (32a) is greater than diameter (d3) (μm) of third via conductors (34a, 35a, 34b, 35b) formed in upper and lower buildup layers (B1, B2) respectively, as shown in FIGS. 1 and 3. In addition, diameter (d2) (μm) of upper and lower second via conductors (33a, 33b) is greater than diameter (d3) (μm) of third via conductors (34a, 35a, 34b, 35b). Diameter (d2) (μm) of second via conductors (33a, 33b) is greater than diameter (d1) (μm) of first via conductor (32a). Diameter (d1) is the same in each of the first via conductors in laminated-inductor forming section (A1). The diameter of a via conductor indicates the top diameter (the diameter at the interface between the insulation layer and the land of a via conductor) as shown in FIG. 3. The opening for a via conductor is formed from the top diameter side. For example, diameter (d1) of first via conductors (31, 32a, 32b) is 80 μm, and diameter (d2) of second via conductors (33a, 33b) is 100 μm. Diameter (d3) of third via conductors (34a, 35a, 34b, 35b) is 50 μm. As described, by setting diameter (d1) of first via conductors (31, 32a, 32b) of laminated inductors (L1, L2) to be greater than diameter (d3) of third via conductors (34a, 35a, 34b, 35b), the resistance of the conductor portion connecting each inductor pattern is reduced, thereby further improving the characteristics of laminated inductors (L1, L2) (especially the Q factor).

In the present embodiment, thickness (s1) (μm) of inductor patterns (42a, 43a, 42b, 43b) of laminated inductors (L1, L2) is greater than thickness (s3) (μm) of third conductive layers (45a, 46a, 45b, 46b) in upper and lower buildup layers (B1, B2). Thickness (s1) (μm) of inductor patterns is preferred to be greater than thickness (s2) (μm) of second conductive layer (44a). For example, thickness (s1) of each inductor pattern is 20~40 μm, and thickness (s2) of upper and lower second conductive layers (44a, 44b) is 12~18 μm, and thickness (s3) of third conductive layers (45a, 46a, 45b, 46b) in buildup layers (B1, B2) is 5~15 μm. As described, by setting the thickness of each inductor pattern of laminated inductors (L1, L2) to be greater relative to the others, loss and resistance are reduced in laminated inductors (L1, L2), thereby stabilizing the inductance of laminated inductors (L1, L2). Moreover, laminated inductors (L1, L2) exhibit enhanced performance. In addition, the rigidity and strength of core substrate 10 are improved. Furthermore, by setting thicknesses (s2, s3) of second conductive layer (44a) and third conductive layer (45a) to be smaller relative to the others, second conductive layer (44a) and third conductive layer (45a) are made finer and the thickness of wiring board 100 is reduced. Moreover, when the thicknesses of second conductive layer (44a) and third conductive layer (45a) are smaller relative to the others, a void is suppressed from occurring in third insulation layers (23a, 24a), covering second conductive layer (44a) and third conductive layer (45a).

In the present embodiment, inductor patterns (42a, 43a, 42b, 43b) of laminated inductors (L1, L2) are each made of copper foil formed on the insulation layer, electroless plated film on the copper foil, and electrolytic plated film on the electroless plated film. Low-resistance inductor patterns are formed when each inductor pattern is formed as above.

In the present embodiment, thicknesses (t1, t2) (μm) of insulation layers in laminated-inductor forming section (A1) (first insulation layers (11, 11a, 11b) and second insulation layers (21a, 21b) respectively) are greater than thickness (t3) (μm) of third insulation layers (23a, 24a, 23b, 24b) in buildup layers (B1, B2). The thickness of an insulation layer is the distance between adjacent conductive layers as shown in FIG. 3. For example, thickness (t1) of first insulation layers (11, 11a, 11b) in laminated-inductor forming section (A1) is approximately 60 μm, and thickness (t3) of third insulation layers (23a, 24a, 23b, 24b) in buildup layers (B1, B2) is approximately 40 μm. In addition, thickness (t2) of second insulation layers (21a, 21b) is 100~150 μm, which is greater than either of thickness (t1) of each first insulation layer of laminated-inductor forming section (A1) and thickness (t3) of each third insulation layer in buildup layer (B1, B2). Distance (D1) (μm) between upper planar conductor (A2) and uppermost inductor pattern (43a) and distance (D2) (μm) between lower planar conductor (A3) and lowermost inductor pattern (43b) are each 100~150 μm (see FIG. 1). As described, by setting the thicknesses of first insulation layers (11, 11a, 11b) and second insulation layers (21a, 21b) of core substrate 10 to be greater relative to the others, the rigidity of core substrate 10 is ensured. Moreover, the length of first via conductors (31, 32a, 32b) of laminated inductors (L1, L2) becomes greater relative to the others. Accordingly, it is easier to achieve desired inductance in laminated inductors (L1, L2). Also, by setting the thickness of a third insulation layer to be thinner relative to the others, fine via conductors are formed in the third insulation layer, and the thickness of wiring board 100 is thereby reduced.

In the present embodiment, uppermost inductor patterns (43a) of laminated inductors (L1, L2) and uppermost third conductive layer (46a) of upper buildup layer (B1) are connected through stacked-via structures as shown in FIG. 1.

Figure 4C:
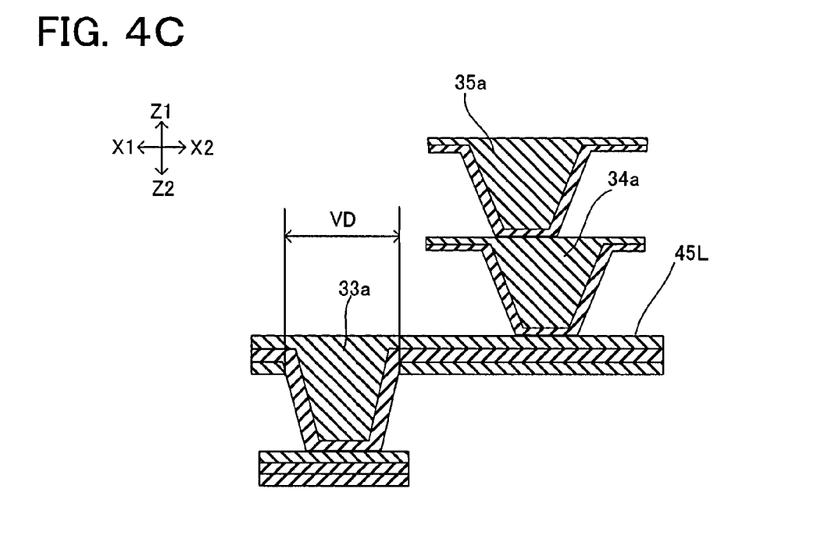
FIG. 4C is a view showing via conductors related to a reference example which are laminated by being offset from each other.
Figure 4D:
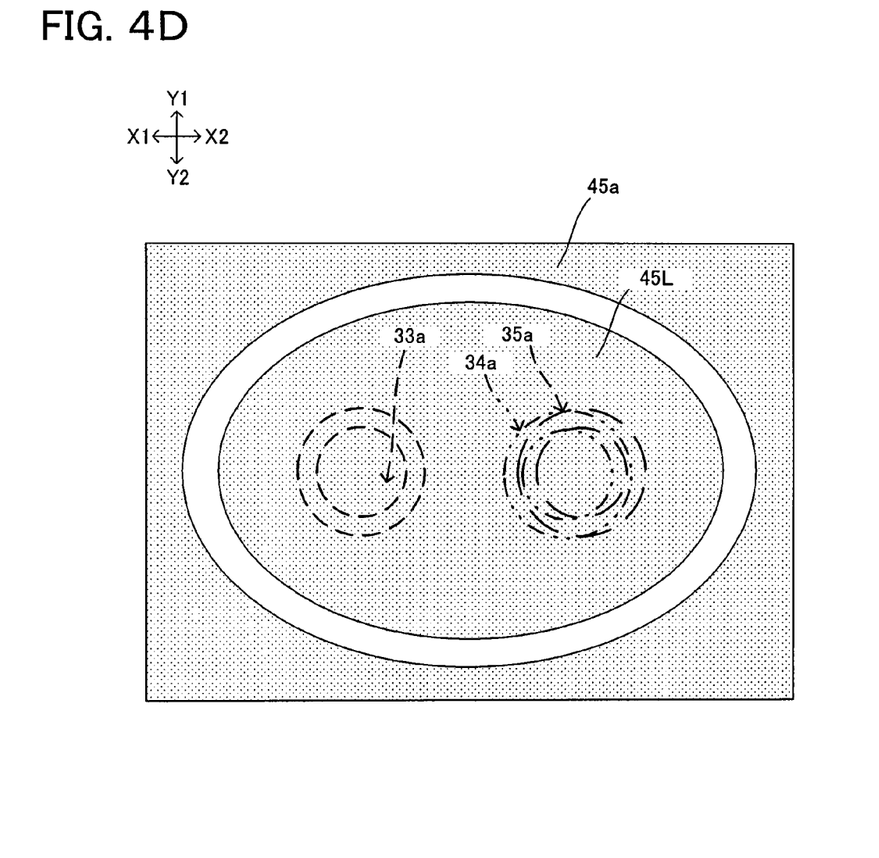
FIG. 4D is a plan view showing lands of via conductors related to the reference example.

As shown in FIGS. 4C and 4D, if two via conductors, that is, second via conductor (33a) and third via conductor (34a), positioned vertically to each other, are offset in a planar direction (X1-X2 direction), the area of land (45L) of second via conductor (33a) positioned on the lower side (see FIG. 4D) is greater relative to the other. Because of greater land (45L), inductance of laminated inductors (L1, L2) may be inhibited, reducing the inductance of laminated inductors (L1, L2). Land (45L) is formed around second via conductor (33a), and is the conductor portion to which third via conductor (34a) positioned on the upper side is connected. By contrast, if two via conductors, that is, second via conductor (33a) and third via conductor (34a), positioned vertically to each other, are laminated in a straight line as shown in FIG. 4A, the area of land (45L) decreases relative to the other. Thus, the inductance of laminated inductors (L1, L2) will not be inhibited by land (45L). As a result, laminated inductors (L1, L2) achieve desired inductance. When second via conductor (33a) and third via conductor (34a) positioned vertically to each other are laminated in a straight line, the center line passing through the center of third via conductor (34a) positioned on the upper side passes through the via-conductor opening for second via conductor (33a) positioned on the lower side. The center line is shown in FIG. 7.

In the present embodiment, land (45L) is a conductor shaped substantially as a circle or substantially as an ellipse directly connected to the via conductor. When a via conductor is laminated onto land (45L), it is not always necessary for wiring other than second via conductor (33a) and third via conductors (34a, 35a) to be connected to land (45L) (see FIG. 4A, 4C, 4D).

Manufacturing Process for Wiring Board

The following is an example of a method for manufacturing wiring board 100 according to an embodiment of the present invention.

Figure 5A:
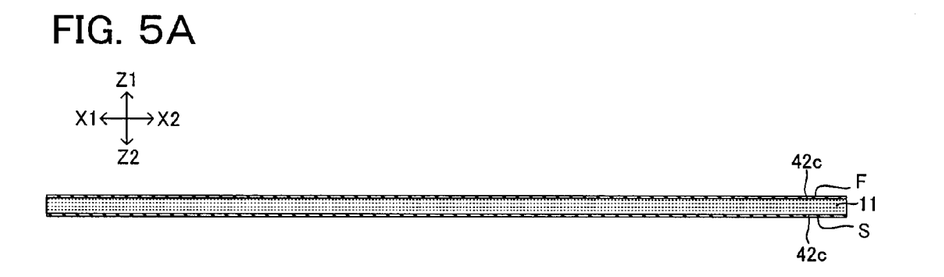
FIG. 5A is a cross-sectional view illustrating a method for manufacturing a wiring board according to an embodiment of the present invention.

As shown in FIG. 5A, first, a double-sided copper-clad laminate (CCL-HL832NSLC) is prepared, which is made of first insulation layer 11 having upper surface (F) and lower surface (S) opposite upper surface (F) and of copper foil (42c) laminated on both surfaces of first insulation layer 11.

Figure 5B:
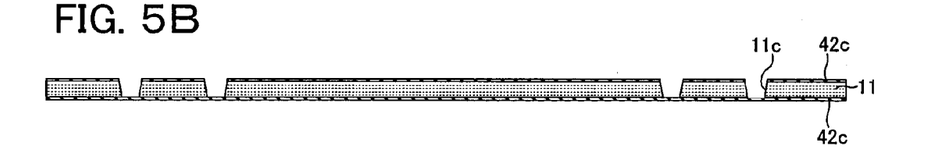
FIG. 5B is a cross-sectional view illustrating the method for manufacturing a wiring board according to the embodiment.

Next, as shown in FIG. 5B, using a laser, opening (11c) is formed to penetrate through upper-surface side copper foil (42c) and first insulation layer 11. Then, a conductive pattern is formed on both surfaces of first insulation layer 11 using a subtractive method.

Figure 5C:
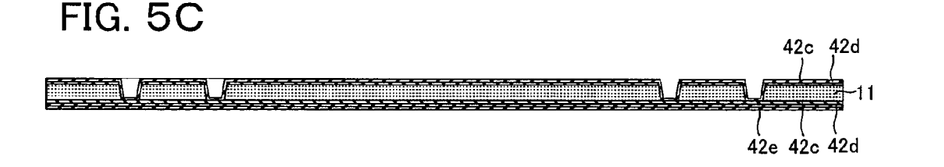
FIG. 5C is a cross-sectional view illustrating the method for manufacturing a wiring board according to the embodiment.
Figure 5D:
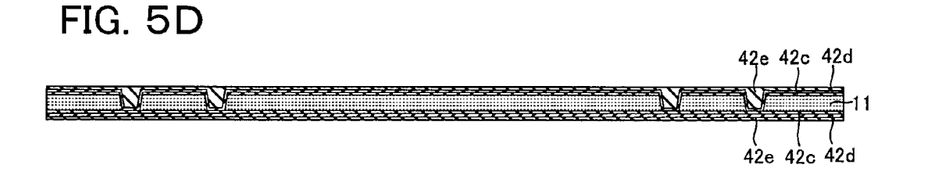
FIG. 5D is a cross-sectional view illustrating the method for manufacturing a wiring board according to the embodiment.

More specifically, as shown in FIGS. 5C and 5D, electroless plated film (42d) is formed on copper foil (42c) and in opening (11c). Furthermore, electrolytic plating is conducted to form electrolytic plated film (42e) on electroless copper plated film (42d), and opening (11c) is filled with electrolytic plated film (42e).

Figure 5E:
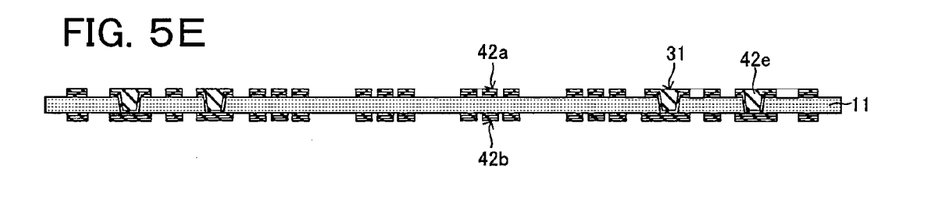
FIG. 5E is a cross-sectional view illustrating the method for manufacturing a wiring board according to the embodiment.

As shown in FIG. 5E, etching resist (not shown) is formed on electrolytic plated film (42e). Then, electrolytic plated film (42e), electroless plated film (42d) and copper foil (42c) exposed from the etching resist are removed. In addition, the etching resist is removed so as to form middle first via conductor 31 made of electroless plated film (42d) and electrolytic plated film (42e) and to form upper and lower first conductive layers made of copper foil (42c), electroless plated film (42d) on copper foil (42c) and electrolytic plated film (42e) on electroless plated film (42d). The upper first conductive layer includes upper inductor pattern (42a), and the lower first conductive layer includes lower inductor pattern (42b). The upper first conductive layer and the lower first conductive layer are connected by middle first via conductor 31, and a double-sided board is thereby completed.

Figure 5F:
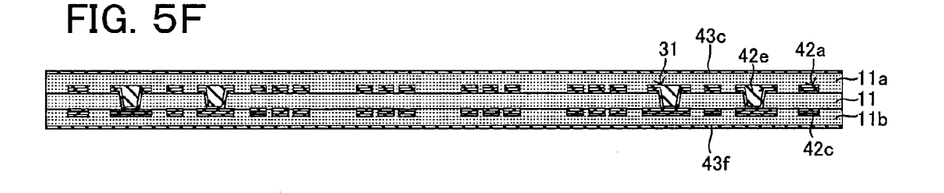
FIG. 5F is a cross-sectional view illustrating the method for manufacturing a wiring board according to the embodiment.

As shown in FIG. 5F, prepreg and copper foil (43c) are laminated on the upper surface of first insulation layer 11 and the upper first conductive layer. Also, prepreg and copper foil (43f) are laminated under the lower surface of first insulation layer 11 and the lower first conductive layer. Then, heat and pressure are applied to form uppermost first insulation layer (11a) and lowermost first insulation layer (11b) from the prepreg. Middle first insulation layer 11 is formed between uppermost and lowermost first insulation layers (11a, 11b).

Figure 5G:
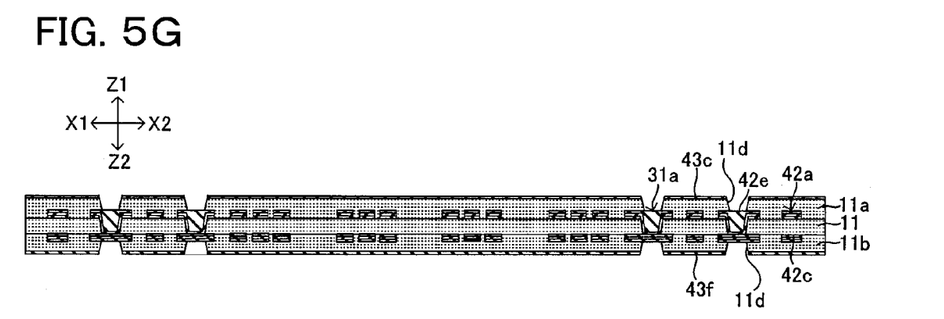
FIG. 5G is a cross-sectional view illustrating the method for manufacturing a wiring board according to the embodiment.

As shown in FIG. 5G, a laser is used to form opening (11d) for uppermost first via conductor (32a) in uppermost first insulation layer (11a). Opening (11d) reaches the upper first conductive layer. Also, opening (11d) for lowermost first via conductor (32b) is formed in lowermost first insulation layer (11b). Opening (11d) reaches the lower first conductive layer. Diameter (VD) ($\mu$m) of a via conductor and a via-conductor opening is the diameter (top diameter) measured at the interface between the insulation layer and the via-conductor land (see FIG. 4C).

Figure 5H:
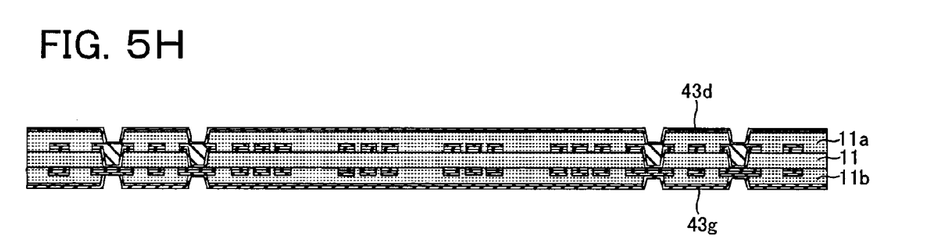
FIG. 5H is a cross-sectional view illustrating the method for manufacturing a wiring board according to the embodiment.

As shown in FIG. 5H, electroless plated films (43d, 43g) are formed on copper foils (43c, 43f) and in openings (11d).

Figure 5I:
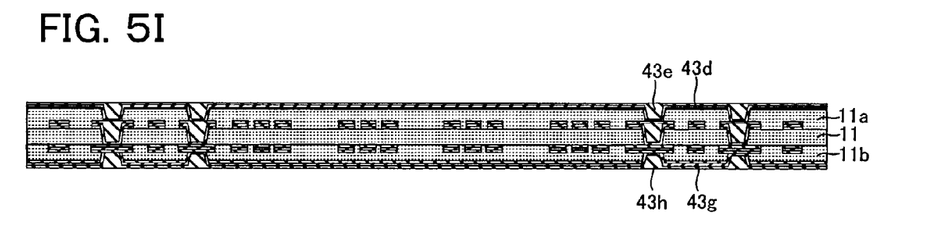
FIG. 5I is a cross-sectional view illustrating the method for manufacturing a wiring board according to the embodiment.

As shown in FIG. 5I, electrolytic plating is performed to form electrolytic plated films (43e, 43h) on electroless plated films (43d, 43g). Electrolytic plated films (43e, 43h) are filled in openings (11d).

Figure 5J:
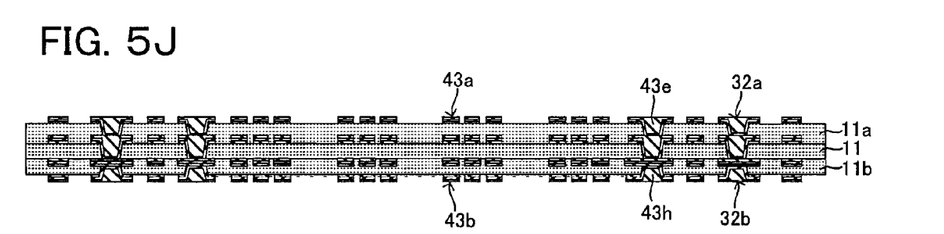
FIG. 5J is a cross-sectional view illustrating the method for manufacturing a wiring board according to the embodiment of the present invention.

As shown in FIG. 5J, etching resist (not shown) is formed on electrolytic plated films (43e, 43h). Then, electrolytic plated films (43e, 43h), electroless plated films (43d, 43g) and copper foils (43c, 43f) exposed from the etching resist are removed.

The etching resist is removed. An uppermost first conductive layer including uppermost inductor pattern (43a) is formed on uppermost first insulation layer (11a). A lowermost first conductive layer including lowermost inductor pattern (43b) is formed under lowermost first insulation layer (11b). The uppermost and lowermost first conductive layers are respectively made of copper foils (43c, 43f), electroless plated films (43d, 43g) on copper foils (43c, 43f), and electrolytic plated films (43e, 43h) on electroless plated films (43d, 43g). Also, uppermost first via conductor (32a) is formed in uppermost first insulation layer (11a), connecting the uppermost first conductive layer and the upper first conductive layer, and lowermost first via conductor (32b) is formed in lowermost first insulation layer (11b), connecting the lowermost first conductive layer and the lower first conductive layer. Uppermost and lowermost first via conductors (32a, 32b) are made of electroless plated film and electrolytic plated film on the electroless plated film.

Figure 5K:
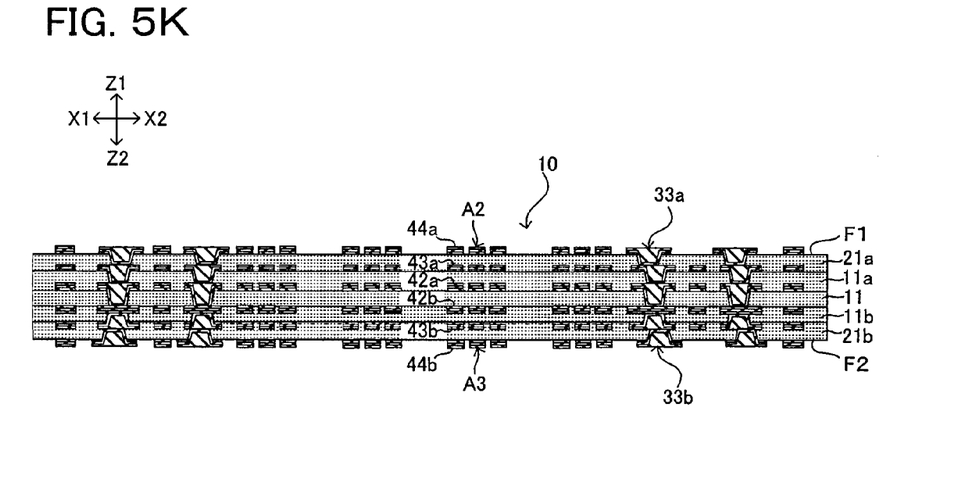
FIG. 5K is a cross-sectional view illustrating the method for manufacturing a wiring board according to the embodiment.

As shown in FIG. 5K, prepreg and copper foil are laminated on uppermost first insulation layer (11a) and the uppermost first conductive layer. Also, prepreg and copper foil are laminated under lowermost first insulation layer (11b) and the lowermost first conductive layer. Upper second insulation layer (21a) is formed on uppermost first insulation layer (11a) and on the uppermost first conductive layer from the prepreg when heat and pressure are applied. Also, lower second insulation layer (21b) is formed under lowermost first insulation layer (11b) and the lowermost first conductive layer. Here, the thickness of the prepreg is adjusted so that the thicknesses of upper and lower second insulation layers (21a, 21b) are each set at 100 $\mu$m or greater. Also, by so setting, distances (D1, D2) are each set at 100 $\mu$m or greater.

Using a $CO_2$ gas laser, an opening is formed to penetrate through upper second insulation layer (21a) and to reach the uppermost first conductive layer. Also, an opening is formed to penetrate through lower second insulation layer (21b) and to reach the lowermost first conductive layer.

Electroless plated film is formed on the copper foil on upper and lower second insulation layers (21a, 21b) and in the openings. Then, electrolytic plated film is formed on the electroless plated film.

Etching resist is formed on the electrolytic plated film. Then, the electrolytic plated film, electroless plated film and copper foil exposed from the etching resist are removed, and the etching resist is removed.

Accordingly, upper second conductive layer (44a) including upper planar conductor (A2) is formed on upper second insulation layer (21a). Upper second via conductor (33a) is formed in upper second insulation layer (21a), connecting upper second conductive layer (44a) and the uppermost first conductive layer. Lower second conductive layer (44b) including lower planar conductor (A3) is formed under lower second insulation layer (21b). Lower second via conductor (33b) is formed in lower second insulation layer (21b), connecting lower second conductive layer (44b) and the lowermost first conductive layer.

Here, distance (D1) between upper planar conductor (A2) and uppermost inductor pattern (43a) is 100 µm or greater. Also, distance (d2) between lower planar conductor (A3) and lowermost inductor pattern (43b) is 100 µm or greater.

By the procedures described above, core substrate 10 of the present embodiment is completed as shown in FIG. 5K.

Figure 5L:
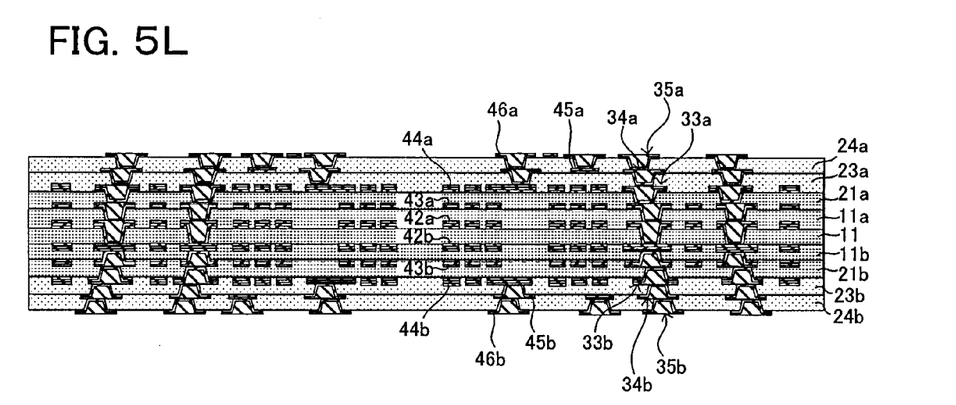
FIG. 5L is a cross-sectional view illustrating the method for manufacturing a wiring board according to the embodiment of the present invention.

Following the above procedures, upper buildup layer (B1) is formed on first main surface (F1) and lower buildup layer (B2) is formed under second main surface (F2) of core substrate 10 (see FIG. 1), as shown in FIG. 5L.

Namely, resin film (brand name: ABF-45SH, made by Ajinomoto) to form interlayer resin insulation layers (upper and lower third insulation layers) without containing reinforcing material is laminated on both surfaces of core substrate 10. Next, thermosetting is performed to form third insulation layers (23a, 23b) as interlayer resin insulation layers on both surfaces of core substrate 10. Then, via-conductor openings are formed in third insulation layers (23a, 23b). Moreover, using a semi-additive method, upper and lower third conductive layers (45a, 45b) and upper and lower third via conductors (34a, 34b) are formed. In the same manner, uppermost and lowermost third insulation layers (24a, 24b), uppermost and lowermost third via conductors (35a, 35b) and uppermost and lowermost third conductive layers (46a, 46b) are formed. Upper buildup layer (B1) is formed on core substrate 10, and lower buildup layer (B2) is formed under core substrate 10.

Figure 5M:
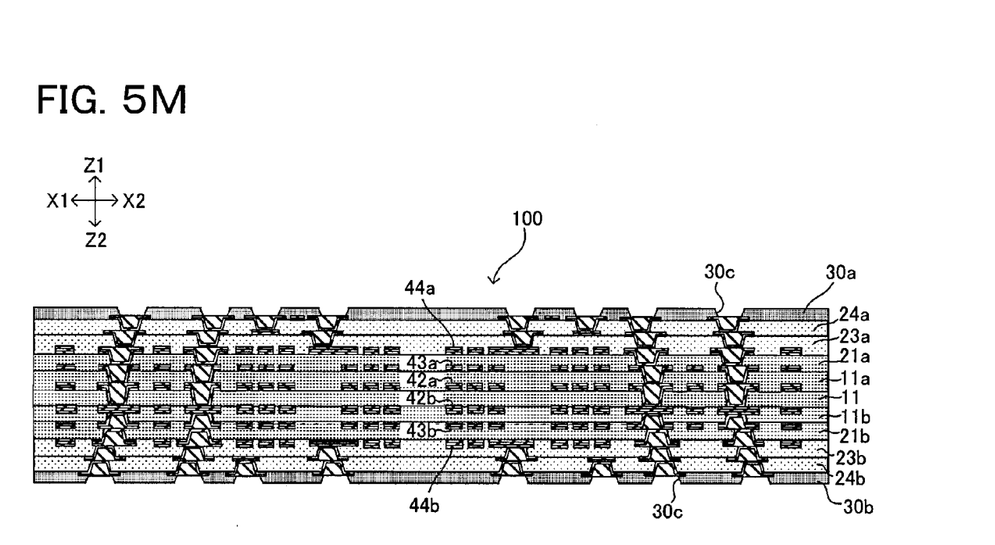
FIG. 5M is a cross-sectional view illustrating the method for manufacturing a wiring board according to the embodiment.

As shown in FIG. 5M, upper solder-resist layer (30a) having opening (30c) is formed on upper buildup layer (B1), and lower solder-resist layer (30b) having opening (30c) is formed under lower buildup layer (B2).

Figure 5N:
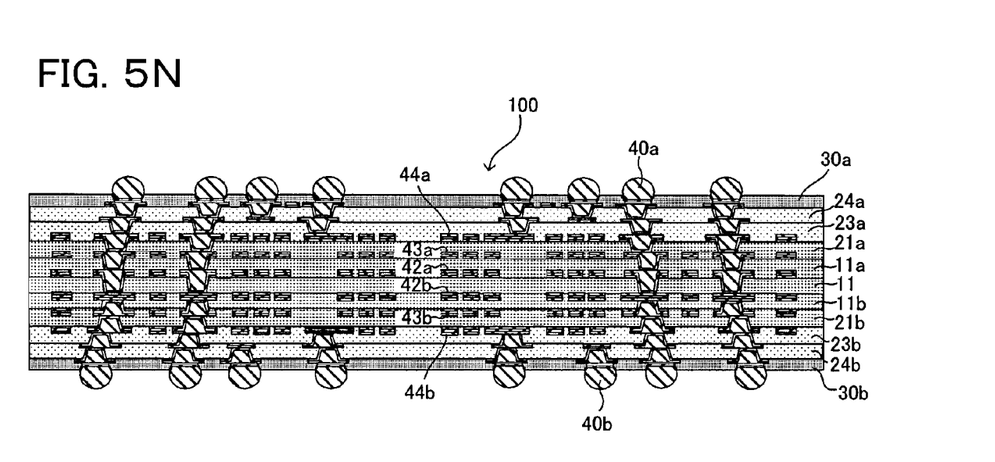
FIG. 5N is a cross-sectional view illustrating the method for manufacturing a wiring board according to the embodiment.

Lastly, as shown in FIG. 5N, solder bump (40a) is formed on uppermost third conductive layer (46a) exposed from opening (30c) of upper solder-resist layer (30a), and solder bump (40b) is formed under the lowermost third conductive layer (46b) exposed from opening (30c) of lower solder-resist layer (30b).

Wiring board 100 shown in FIG. 1 is completed by the procedures described above.

For mobile electronic devices represented by cellphones and laptop computers, low-voltage microprocessors with low drive voltage and low power consumption are used. By using a low-voltage microprocessor, heat generated by the electronic device is reduced, making the electronic device capable of running longer with a low-capacity battery.

When the wiring distance is long between the power source and the microprocessor, the impedance in wiring increases at a relatively low frequency, and a problem in supplying power may occur.

However, in such a laminated inductor, magnetic flux (lines of magnetic force) generated in the laminated inductor is inhibited by the planar conductors formed on both sides of core substrate 10. In addition, because of eddy current or the like generated in the planar conductors, desired inductor characteristics (inductance, Q factor) may not be obtained in the laminated inductor.

A wiring board according to an embodiment of the present invention can achieve desired inductor characteristics (inductance, Q factor) in a wiring board having a laminated inductor.

A wiring board according to an embodiment of the present invention has a laminated-inductor forming section which includes an uppermost first insulation layer, a lowermost first insulation layer, a middle first insulation layer formed between the uppermost first insulation layer and the lowermost first insulation layer, an uppermost inductor pattern formed on the uppermost first insulation layer, a lowermost inductor pattern formed under the lowermost first insulation layer, an upper inductor pattern formed between the uppermost first insulation layer and the middle first insulation layer, a lower inductor pattern formed between the lowermost first insulation layer and the middle first insulation layer, an uppermost first via conductor which penetrates through the uppermost first insulation layer and connects the uppermost inductor pattern and the upper inductor pattern, a middle first via conductor which penetrates through the middle first insulation layer and connects the upper inductor pattern and the lower inductor pattern, and a lowermost first via conductor which penetrates through the lowermost first insulation layer and connects the lowermost inductor pattern and the lower inductor pattern. The wiring board also has an upper second insulation layer which is formed on the uppermost first insulation layer and the uppermost inductor pattern in the laminated-inductor forming section, and an upper planar conductor formed above the uppermost inductor pattern with the upper second insulation layer disposed in between. In the wiring board, the uppermost inductor pattern is positioned away from the upper planar conductor by 100 µm or more.

A wiring board according to an embodiment of the present invention can achieve desired inductor characteristics (inductance, Q factor) in a wiring board having a laminated inductor.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
a substrate having a laminated-inductor forming portion and comprising a plurality of first insulation layers and a second insulation layer formed on a first side of the plurality of first insulation layers such that the plurality of first insulation layers has the laminated-inductor forming portion; and
a planar conductor formed on the second insulation layer of the substrate and configured to shield electromagnetic force generated from the laminated-inductor forming portion of the substrate,
wherein the laminated-inductor forming portion of the substrate has a plurality of inductor patterns formed on the first insulation layers and a plurality of via conductors connecting the inductor patterns through the first insulation layers, and the plurality of inductor patterns includes an uppermost inductor pattern formed between the second insulation layer and the plurality of first insulation layers such that the uppermost inductor pattern has a distance of 100 µm or more from the planar conductor.

2. A wiring board according to claim 1, wherein the plurality of first insulation layers includes an uppermost first insulation layer, a lowermost first insulation layer, a middle first insulation layer formed between the uppermost first insulation layer and the lowermost first insulation layer, the plurality of inductor patterns includes the uppermost inductor pattern formed on the uppermost first insulation layer, a lowermost inductor pattern formed under the lowermost first insulation layer, an upper inductor pattern formed between the uppermost first insulation layer and the middle first insulation layer, a lower inductor pattern formed between the lowermost first insulation layer and the middle first insulation layer, the plurality of via conductors includes an uppermost first via conductor penetrating through the uppermost first insulation layer and connecting the uppermost inductor pattern and the upper inductor pattern, a middle first via conductor penetrating through the middle first insulation layer and connecting the upper inductor pattern and the lower inductor pattern, and a lowermost first via conductor penetrating through the lowermost first insulation layer and connecting the lowermost inductor pattern and the lower inductor pattern, the second insulation layer is formed on the uppermost first insulation layer and the uppermost inductor pattern in the laminated-inductor forming section, and the planar conductor is formed above the uppermost inductor pattern such that the second insulation layer is between the planar conductor and the uppermost inductor pattern.

3. A wiring board according to claim 2, wherein each of the first insulation layers includes a reinforcing material, and the second insulation layer includes a reinforcing material.

4. A wiring board according to claim 2, wherein the planar conductor has a mesh-hole structure.

5. A wiring board according to claim 2, further comprising:
a buildup layer formed on the planar conductor and comprising a third insulation layer and a third conductor layer, wherein the planar conductor has a thickness which is greater than a thickness of the third conductor layer in the buildup layer.

6. A wiring board according to claim 1, wherein the substrate includes a second insulation layer formed on a second side of the plurality of first insulation layers, and a planar conductor formed on the second insulation layer on the second side and configured to shield electromagnetic force generated in the laminated-inductor forming portion, the plurality of inductor patterns includes a lowermost inductor pattern formed between the second insulation layer on the second side and the plurality of first insulation layers such that the lowermost inductor pattern has a distance of 100 µm or more from the planar conductor on the second insulation layer on the second side.

7. A wiring board according to claim 6, wherein each of the first insulation layers includes a reinforcing material, the second insulation layer on the first side of the plurality of first insulation layers includes a reinforcing material, and the second insulation layer formed on the second side of the plurality of first insulation layers includes a reinforcing material.

8. A wiring board according to claim 6, wherein the planar conductor on the second insulation layer on the first side has a mesh-hole structure, and the planar conductor on the second insulation layer on the second side the has a mesh-hole structure.

9. A wiring board according to claim 6, further comprising:
a first buildup layer formed on the planar conductor on the second insulation layer on the first side; and
a second buildup layer formed on the planar conductor on the second insulation layer on the second side.

10. A wiring board according to claim 9, wherein the planar conductor on the second insulation layer on the first side forms a power source conductor, and the planar conductor on the second insulation layer forms one of a power source conductor and a ground conductor.

11. A wiring board according to claim 9, wherein the planar conductor on the second insulation layer on the first side forms a power source conductor and has a mesh-hole structure, and the planar conductor on the second insulation layer forms one of a power source conductor and a ground conductor and has a mesh-hole structure.

12. A wiring board according to claim 6, further comprising:
a first buildup layer configured to mount an electronic component and formed on the planar conductor on the second insulation layer on the first side; and
a second buildup layer configured to mount a mother board and formed on the planar conductor on the second insulation layer on the second side.

13. A wiring board according to claim 12, wherein the planar conductor on the second insulation layer on the first side has a mesh-hole structure, and the planar conductor on the second insulation layer on the second side the has a mesh-hole structure.

14. A wiring board according to claim 12, wherein the planar conductor on the second insulation layer on the first side forms a power source conductor, and the planar conductor on the second insulation layer forms one of a power source conductor and a ground conductor.

15. A wiring board according to claim 12, wherein the planar conductor on the second insulation layer on the first side forms a power source conductor and has a mesh-hole structure, and the planar conductor on the second insulation layer forms one of a power source conductor and a ground conductor and has a mesh-hole structure.

16. A wiring board according to claim 1, wherein the substrate has a via conductor formed through the second insulation layer such that the via conductor is connecting the planar conductor and the uppermost inductor pattern.

17. A wiring board according to claim 16, wherein each of the first insulation layers includes a reinforcing material, and the second insulation layer includes a reinforcing material.

18. A wiring board according to claim 1, wherein each of the first insulation layers includes a reinforcing material, and the second insulation layer includes areinforcing material.

19. A wiring board according to claim 1, wherein the planar conductor has a mesh-hole structure.

20. A wiring board according to claim 1, further comprising:
a buildup layer formed on the planar conductor and comprising a third insulation layer and a third conductor layer, wherein the planar conductor has a thickness which is greater than a thickness of the third conductor layer in the buildup layer.

* * * * *